(12) United States Patent
Horwood et al.

(10) Patent No.: US 12,153,009 B2
(45) Date of Patent: Nov. 26, 2024

(54) SOLVENT INDEPENDENT REFERENCE ELECTRODES FOR USE WITH NON-AQUEOUS ELECTROLYTES

(71) Applicant: Lawrence Livermore National Security, LLC, Livermore, CA (US)

(72) Inventors: Corie Horwood, Livermore, CA (US); Michael Stadermann, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 25 days.

(21) Appl. No.: 17/673,371

(22) Filed: Feb. 16, 2022

(65) Prior Publication Data

US 2022/0170877 A1 Jun. 2, 2022

Related U.S. Application Data

(62) Division of application No. 15/862,374, filed on Jan. 4, 2018, now abandoned.

(51) Int. Cl.
*G01N 27/30* (2006.01)
*C23C 14/06* (2006.01)
*G01N 27/447* (2006.01)

(52) U.S. Cl.
CPC ....... *G01N 27/301* (2013.01); *C23C 14/0623* (2013.01); *G01N 27/44704* (2013.01)

(58) Field of Classification Search
CPC .................. G01N 27/301; G01N 27/44704
See application file for complete search history.

(56) References Cited

U.S. PATENT DOCUMENTS

| 3,736,242 A | 5/1973 | Schwartz et al. |
| 4,116,798 A * | 9/1978 | Magar ................. G01N 27/301 |
| | | 204/404 |
| 6,608,306 B1 * | 8/2003 | Aono ..................... B82Y 30/00 |
| | | 977/869 |

(Continued)

FOREIGN PATENT DOCUMENTS

| CN | 106093156 A | * 11/2016 |
| KR | 10-2011-0049100 A | 5/2011 |

(Continued)

OTHER PUBLICATIONS

B. Huber and B. Roling, Development of a Ag/Ag+ micro-reference electrode for electrochemical measurements in ionic liquids, 56 Electrochimica Acta, 2011, p. 6569-72. (Year: 2011).*

(Continued)

*Primary Examiner* — C. Sun
(74) *Attorney, Agent, or Firm* — HARNESS, DICKEY & PIERCE, P.L.C.

(57) ABSTRACT

The present disclosure relates to a method for forming a reference electrode for use in electrochemical testing applications. The method may involve positioning a porous frit against one end of a hollow tube, and securing the frit and the hollow tube to one another to form an assembly. The method may further involve forming a silver sulfide coating on a silver wire to produce a silver sulfide coated silver wire. The method may further involve filling the hollow tube with a non-aqueous solution, and inserting at least a portion of the silver sulfide coated silver wire into the non-aqueous solution in the hollow tube.

21 Claims, 5 Drawing Sheets

(56) References Cited

U.S. PATENT DOCUMENTS

| | | | |
|---|---|---|---|
| 8,877,037 B2 | 11/2014 | Duimstra et al. | |
| 2001/0037141 A1* | 11/2001 | Yee | A61M 25/00 |
| | | | 606/108 |
| 2007/0138076 A1 | 6/2007 | Daridon et al. | |
| 2009/0000475 A1 | 1/2009 | Fekety et al. | |
| 2014/0158536 A1* | 6/2014 | Thompson | G01N 27/333 |
| | | | 204/406 |

FOREIGN PATENT DOCUMENTS

| | | |
|---|---|---|
| KR | 10-2011-0127839 A | 11/2011 |
| KR | 10-2014-0129692 A | 11/2014 |
| WO | WO-2016196702 A1 * | 12/2016 |

OTHER PUBLICATIONS

Horwood, C. & Stadermann, M. Evaluation of a Ag/Ag2S reference electrode with long-term stability for electrochemistry in ionic liquids. Electrochemistry Communications 88, doi:10.1016/j.elecom.2018.02.005 (2018).

Snook, G. A., Best, A. S., Pandolfo, A. G. & Hollenkamp, A. F. Evaluation of a Ag/Ag+ reference electrode for use in room temperature ionic liquids. Electrochemistry Communications 8 (9), 1405-1411, doi:10.1016/j.elecom.2006.07.004 (2006).

Huber, B. & Roling, B. Development of a Ag/Ag+ micro-reference electrode for electrochemical measurements in ionic liquids. Electrochimica Acta 56 (19), 6569-6572, doi:10.1016/j.electacta.2011.02.055 (2011).

Torriero, A. A. J., Sunarso, J. & Howlett, P. C. Critical evaluation of reference systems for voltammetric measurements in ionic liquids. Electrochimica Acta 82, 60-68, doi:10.1016/j.electacta.2012.01.115 (2012).

Kakiuchi, T., Yoshimatsu, T. & Nishi, N. New class of Ag/AgCl electrodes based on hydrophobic ionic liquid saturated with AgCl. Analytical Chemistry 79 (18), 7187-7197 (2007).

Hultgren, V. M., Mariotti, A. W. A., Bond, A. M. & Wedd, A. G. Reference potential calibration and voltammetry at macrodisk electrodes of metallocene derivatives in the ionic liquid [bmim][PF6]. Analytical Chemistry 74 (13), 3151-3156, doi:10.1021/ac015729k (2002).

Figueredo-Sobrinho, F. A. A. et al. Morphological dependence of silver electrodeposits investigated by changing the ionic liquid solvent and the deposition parameters. Phys. Chem. Chem. Phys. 18 (10), 7242-7250, doi:10.1039/C5CP06665D (2016).

Endres, F. Ionic liquids: solvents for the electrodeposition of metals and semiconductors. ChemPhysChem 3, 144-154 (2002).

Zhang, J. & Bond, A. M. Practical considerations associated with voltammetric studies in room temperature ionic liquids. The Analyst 130 (8), 1132-1147, doi:10.1039/b504721h (2005).

Brown, R. J. C., Dyson, P. J., Ellis, D. J. & Welton, T. 1-Butyl-3-methylimidazolium cobalt tetracarbonyl [bmim][Co(CO)4]: a catalytically active organometallic ionic liquid. Chemical Communications 37 (18), 1862-1863, doi:10.1039/b104601m (2001).

Caban, K., Donten, M. & Stojek, Z. Electroformation of microlayers of ionic liquids in undiluted nitromethane and its homologues. Unusual oscillations behind the range of limiting steady-state current. Journal of Physical Chemistry B 108, 1153-1159, doi:10.1021/jp036637x (2004).

Suarez, P. A. Z. et al. Enlarged electrochemical window in dialkyl-imidazolium cation based room-temperature air and water-stable molten salts. Electrochimica Acta 42 (16), 2533-2535, doi:10.1016/S0013-4686(96)00444-6 (1997).

International Search Report and Written Opinion for corresponding Application No. PCT/US2019/012146, mailed May 7, 2019.

* cited by examiner

SOLVENT INDEPENDENT REFERENCE ELECTRODES FOR USE WITH NON-AQUEOUS ELECTROLYTES

CROSS-REFERENCE

This application is a divisional of U.S. patent application Ser. No. 15/862,374 filed on Jan. 4, 2018. The entire disclosure of the above application is incorporated herein by reference.

FEDERALLY SPONSORED RESEARCH OR DEVELOPMENT

This invention was made with Government support under Contract No. DE-AC52-07NA27344 awarded by the United States Department of Energy. The Government has certain rights in the invention.

FIELD

The present disclosure relates to electrodes used with non-aqueous solutions, and more particularly to a reference electrode constructed such that its output is largely independent of the solution both within the electrode and outside the electrode.

BACKGROUND

This section provides background information related to the present disclosure which is not necessarily prior art.

Reference electrodes are used in experimental electrochemistry to provide a constant calibration point to which all other potentials, either applied in the case of potential control, or observed in the case of current control, are related. The potential of common reference electrodes for aqueous electrochemistry, such as silver/silver chloride or saturated calomel electrodes, is well known for a variety of temperatures, pH, electrolytes, etc. These universal electrodes allow for comparison and reproducibility between different experimental conditions and different labs.

When experiments are operated with controlled potential (i.e., potentiostatic or voltammetry), the potential between the working and counter electrode varies with the electrodes (materials, coatings, etc.) and the properties of the electrolyte (e.g., concentration, pH, etc.), which can change throughout the experiment. When a reference electrode is used, the potential of the working electrode is controlled relative to the reference electrode, allowing the counter electrode to drift in potential as required to mirror the current flowing through the working electrode. Unlike the counter electrode, for a well-made reference electrode, the potential should not drift throughout the experiment, allowing for precise control of potential at the working electrode. FIGS. 1 and 2 illustrate the undesirable potential drift of a quasi-reference electrode making use of a platinum wire.

There is currently no universal reference electrode for electrochemical work with ionic liquids. The most commonly used reference system involves a silver or platinum wire reference electrode placed directly in the electrolyte, referred to as a quasi-reference electrode. The potential is determined by oxides or other surface coatings on the wire, and therefore varies with the type, quality and cleanliness of the wire. To calibrate the wire reference electrode, a redox couple, such as ferrocene/ferrocenium, is added to the electrolyte. The reduction and oxidation potentials of this redox couple is measured versus the reference electrode wire, and the experimental potentials are corrected to the midpoint of the redox couple reduction/oxidation potentials.

Accordingly, it would be highly desirable to provide a stable and reproducible reference electrode for use with ionic liquids that does not require frequent calibration with an added redox couple. The potential of the desired reference electrode ideally should be nearly constant regardless of the electrolyte. The reproducibility between labs should also be better than the current standard for reference electrodes, where the potential depends on an unknown reaction which can change throughout the experiment (i.e., if a small amount of metal oxide on the wire surface is reduced to metal, the reaction will change to involve other species on the wire).

SUMMARY

This section provides a general summary of the disclosure, and is not a comprehensive disclosure of its full scope or all of its features.

In one aspect the present disclosure relates to a method for forming a reference electrode for use in electrochemical testing applications. The method may comprise positioning a porous frit against one end of a hollow tube, and securing the frit and the hollow tube to one another to form an assembly. The method may further include forming a silver sulfide coating on a silver wire to produce a silver sulfide coated silver wire. The method may further include filling the hollow tube with a non-aqueous solution, and inserting at least a portion of the silver sulfide coated silver wire into the non-aqueous solution in the hollow tube.

In another aspect the present disclosure relates to a method for forming a reference electrode for use in electrochemical testing applications. The method may comprise positioning a porous frit against one end of a hollow tube, where the hollow tube has a volume of about 0.1-0.5 mL and a diameter about 4 mm, and securing the frit and the hollow tube to one another to form an assembly. The method may further include forming a silver sulfide coating on a silver wire to produce a silver sulfide coated silver wire, wherein the silver wire, before forming the silver sulfide coating, comprises a diameter of about 0.5 mm, to produce a ratio of the silver wire diameter to the hollow tube diameter of about 1:8. The method may further include filling the hollow tube with a non-aqueous solution, and inserting at least a portion of the silver sulfide coated silver wire into the non-aqueous solution in the hollow tube.

In still another aspect the present disclosure relates to a method for monitoring a reference fluid in an electrochemical testing application. The method may comprise securing a frit to one end of a hollow tube to close off one end of the hollow tube and form an assembly. The method may further include positioning a silver sulfide coated silver wire at least partially within the hollow tube, wherein the silver sulfide coated wire, before being coated with silver sulfide, has a diameter of about 0.5 mm and the hollow tube has an outer diameter of about 4 mm, to produce a ratio of the silver wire diameter to the hollow tube diameter of about 1:8. The method may further include filling the hollow tube with a quantity of a non-aqueous solution, the non-aqueous solution forming a reference fluid. The method may further include inserting at least a portion of the silver sulfide coated silver wire into the reference fluid contained in the hollow tube. The method may also include monitoring a potential difference associated with the reference fluid contained in the assembly during a test or experiment using the silver sulfide coated silver wire.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2:
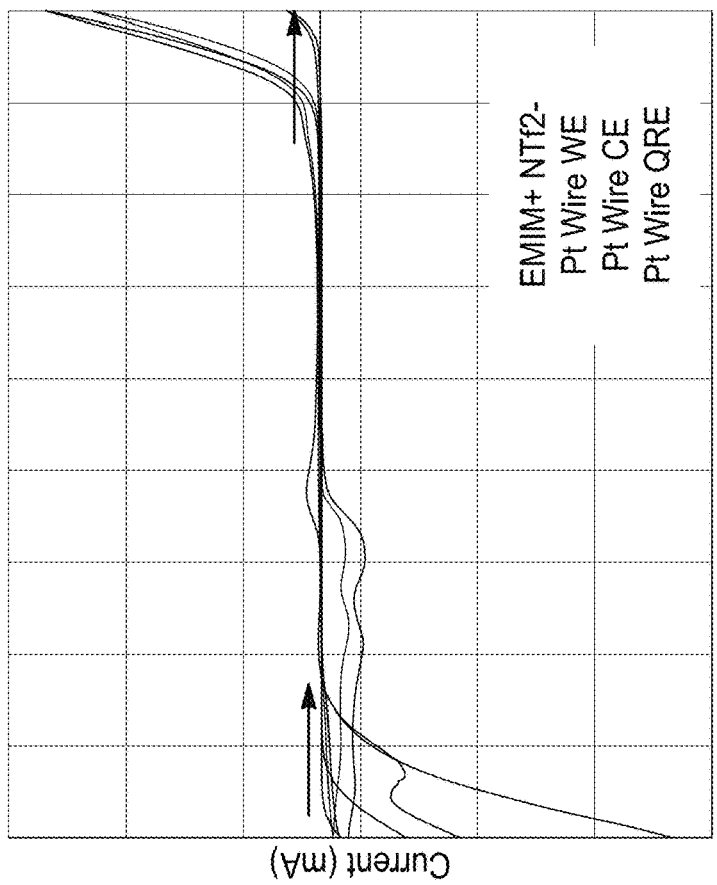
FIG. 2 is a prior art voltage vs. current graph illustrating the current drift of the quasi reference electrode of FIG. 1 but in a different non-aqueous solution (1-ethyl-3-methylimidazolium bis(trifluoromethylsulfonyl)imide, EMIM $NTf_2$)
Figure 1:
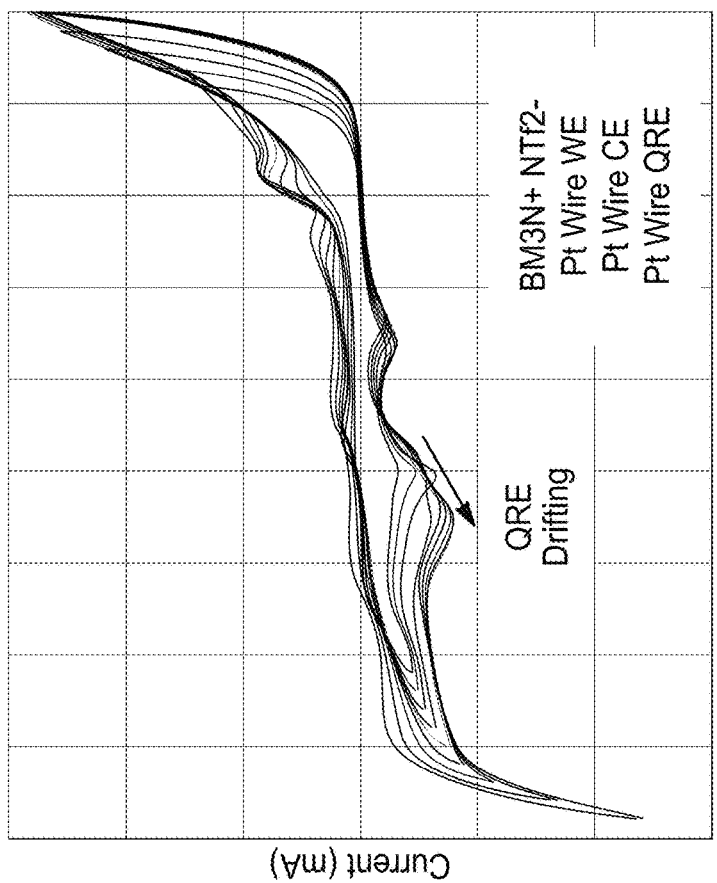
FIG. 1 is a prior art voltage vs. current graph illustrating an example of the current drift of a platinum quasi reference electrode ("QRE") in a non-aqueous solution of butyltrimethylammonium bis(trifluoromethylsulfonyl)imide ($BM_3N$ $NTf_2$), where both the working electrode ("WE") and the counter electrode ("CE") are made from platinum.
Figure 3:
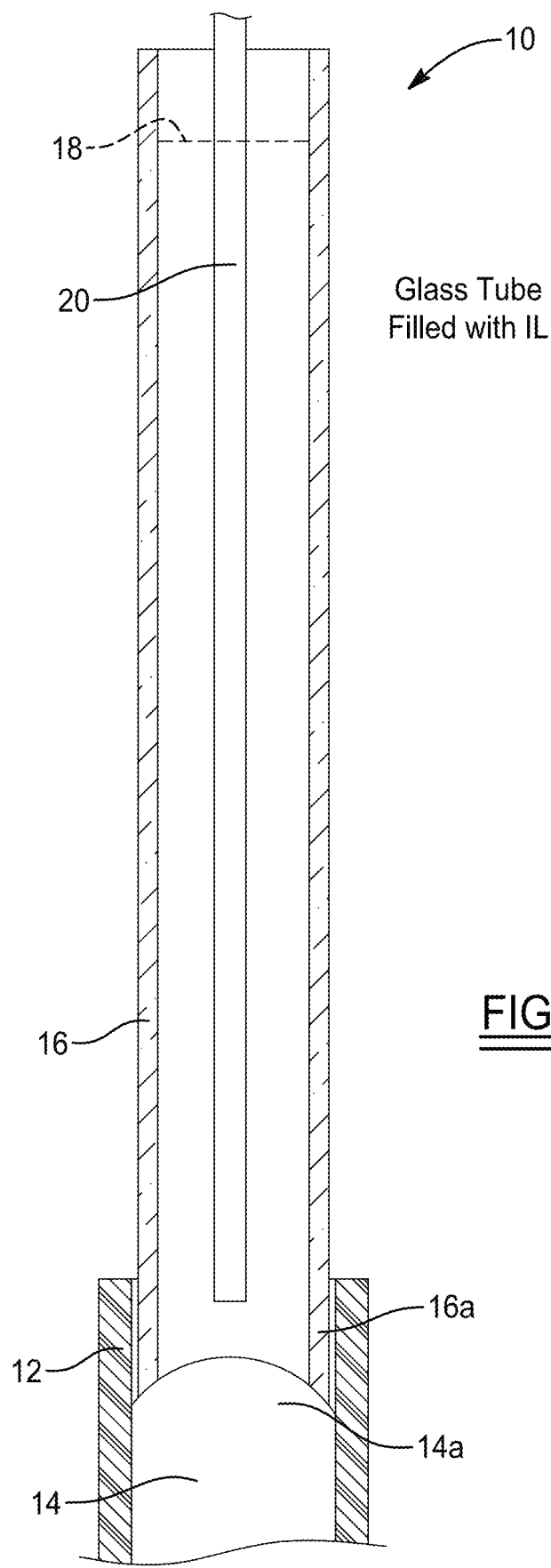
FIG. 3 is a side view of one embodiment of a reference electrode constructed in accordance with the present disclosure.
Figure 5:
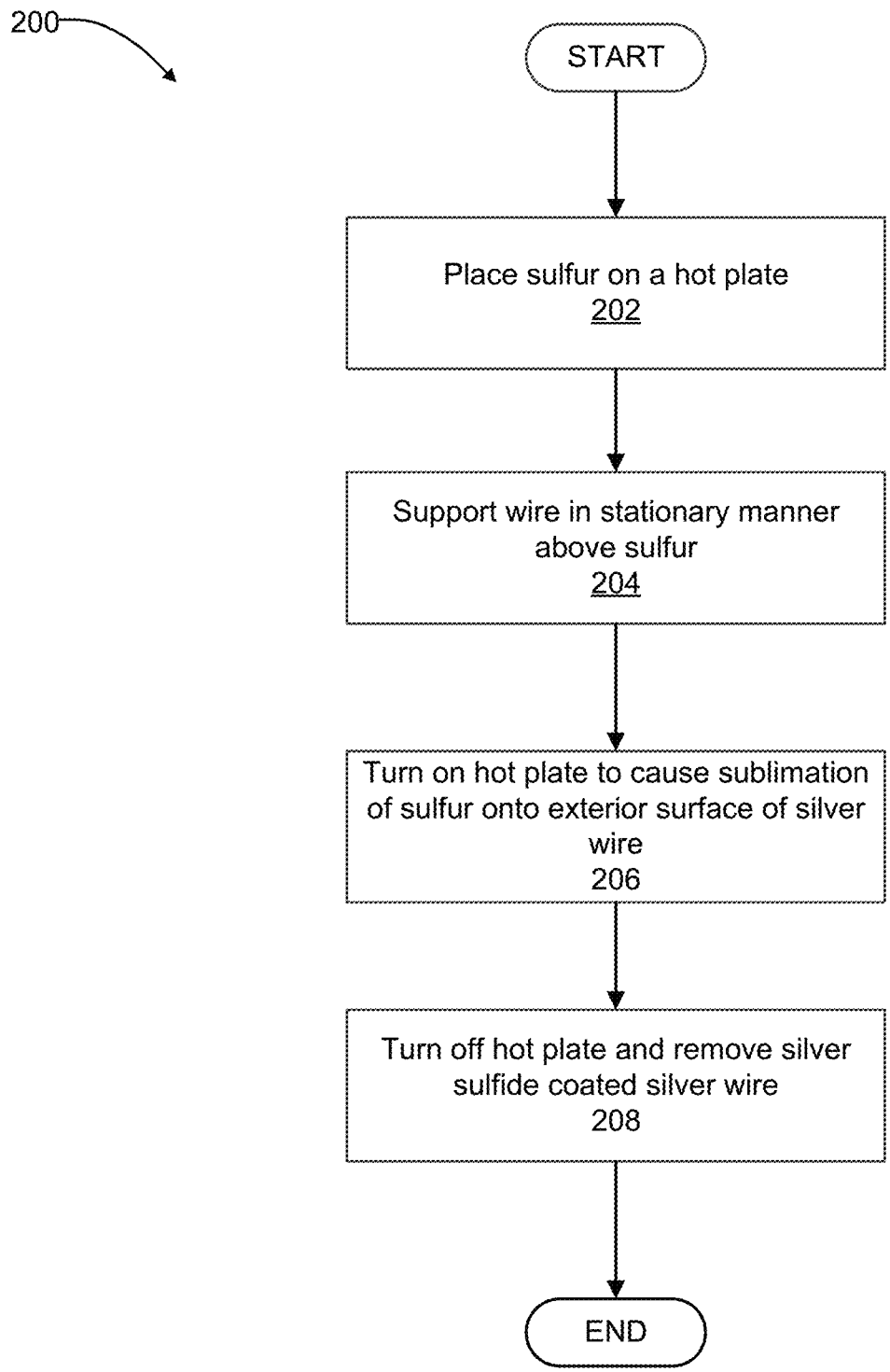
Figure 6:
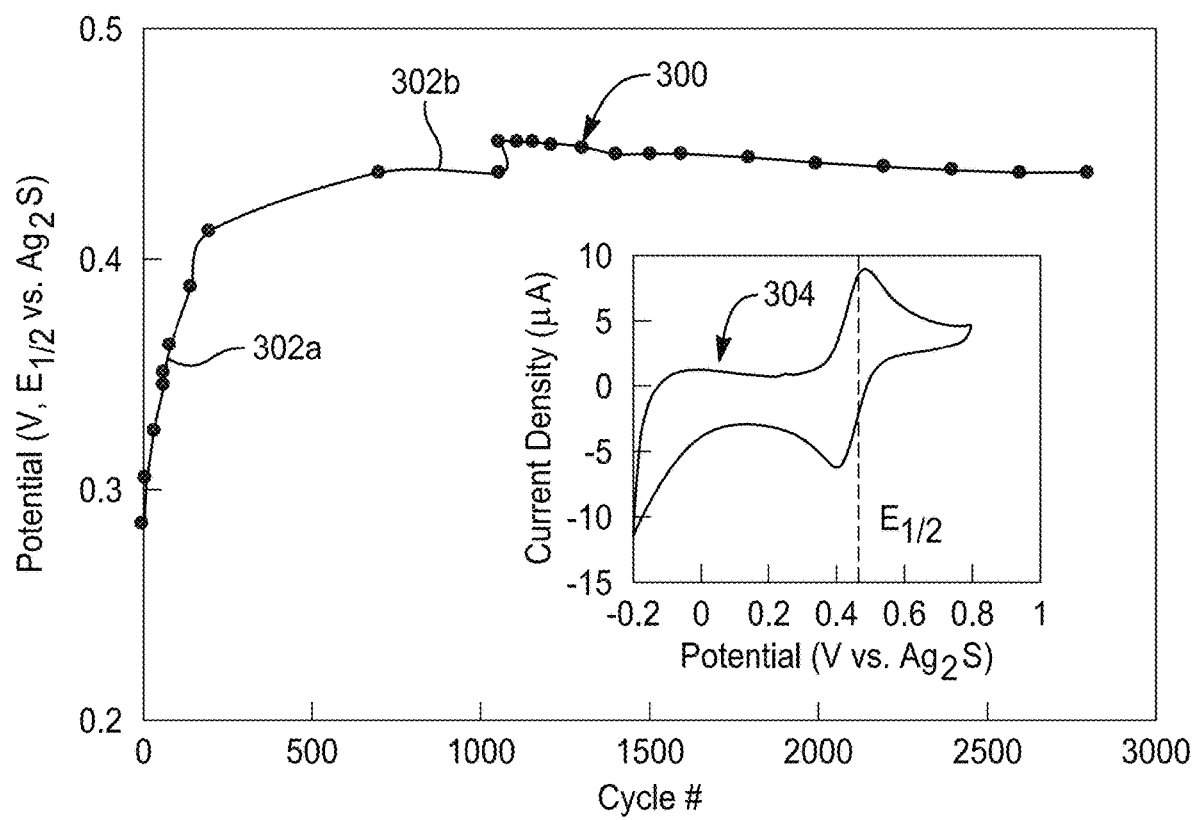

FIG. 5 is a high level flowchart of various operations that may be performed in constructing the silver sulfide coated silver wire used in the reference electrode of FIG. 3; and FIG. 6 is a graph illustrating the general absence of voltage drift of the reference electrode of FIG. 3, once stabilized, over a large number of test cycles (e.g., several thousand test cycles, example shown in inset, in which the voltage is ramped at a specified rate from the lower to the upper voltage limit shown and back).

Corresponding reference numerals indicate corresponding parts throughout the several views of the drawings.

DETAILED DESCRIPTION

Example embodiments will now be described more fully with reference to the accompanying drawings.

In one embodiment the present invention involves a reference electrode formed by a wire, for example a silver wire, having an excess of silver sulfide thereon. The excess of silver sulfide may be visible as a black coating on the silver wire. The silver sulfide coating helps to prevent the reaction and potential change which would otherwise occur throughout an experiment.

The potential of the reaction occurring at the reference electrode is the standard to which the potential at other electrodes in the cell is measured. Therefore, the reaction occurring at the reference electrode must be constant throughout an experiment, and the concentration of reactants and products involved in the reference electrode reaction must not significantly change throughout the experiment. In this invention, the reference electrode reaction is the reduction of silver ions to silver metal:

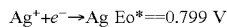
$Ag^+ + e^- \rightarrow Ag$  $Eo^* = 0.799$ V

Silver ions ($Ag^+$) are present in the solution of the reference electrode due to the dissolution of silver sulfide ($Ag_2S$) according to the reaction:

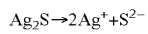
$Ag_2S \rightarrow 2Ag^+ + S^{2-}$

Silver sulfide is effectively insoluble in water, however, it has been shown to have some limited solubility in several ionic liquids. Electrochemistry in ionic liquids is characterized by small current densities at the working electrode, typically microamps per $cm^2$. Normally, a reference electrode is connected to the cell through a high input impedance potentiostat. This results in very little current flowing through the reference electrode, very little silver ion reduction, and very little sulfide production. It is therefore expected that the small increase in sulfide concentration in the reference electrode tube will not significantly change the solubility of silver sulfide, and therefore, will not affect the reduction reaction potential.

The silver sulfide coated silver wire is responsible for the stable reference electrode potential reported here, however, to further improve the reference electrode, it is suggested that a tube with a porous frit be included. Using a tube to contain the silver sulfide coated silver wire reference electrode allows the electrode to stabilize more quickly, and prevents the electrochemical cell from becoming contaminated with silver and sulfide ions from the reference electrode.

Referring to FIG. 3, a high level illustration of an apparatus in the form of a reference electrode 10 in accordance with one embodiment of the present disclosure is shown. The reference electrode 10 (hereinafter simply "electrode" 10) in this example may be constructed for virtually any size electrochemical cell, but in one specific implementation is constructed for use with a small-volume (~2 mL) electrochemical cell, where the electrode diameter needs to be about 4 mm or less. In this example the electrode 10 may be constructed by using a shrink tubing 12, for example a TEFLON™ shrink tubing, to attach a frit, which in this example is an ultrafine porous glass frit 14 to a hollow, small diameter glass tube 16. The glass frit 14 is positioned adjacent one end of the glass tube 16 so as to block off the one end of the glass tube once the shrink wrap tubing 12 is secured over adjacent portions of the glass frit and the glass tube. In this example the porous glass frit 14 and the glass tube 16 are each about 4 mm in diameter. However, it will be appreciated that these dimensions may vary somewhat depending on a specific application. Also, it will be appreciated that the glass frit 14 may instead be placed inside one end of the glass tube 16 and then secured with epoxy, or by melting the tube, or by any other suitable means of securing. Still further, it will be appreciated that the glass tube 16 may instead be a tube made from some other suitable material and coated with a TEFLON™ coating, or a tube made from plastic or from any other suitable material.

Figure 4:
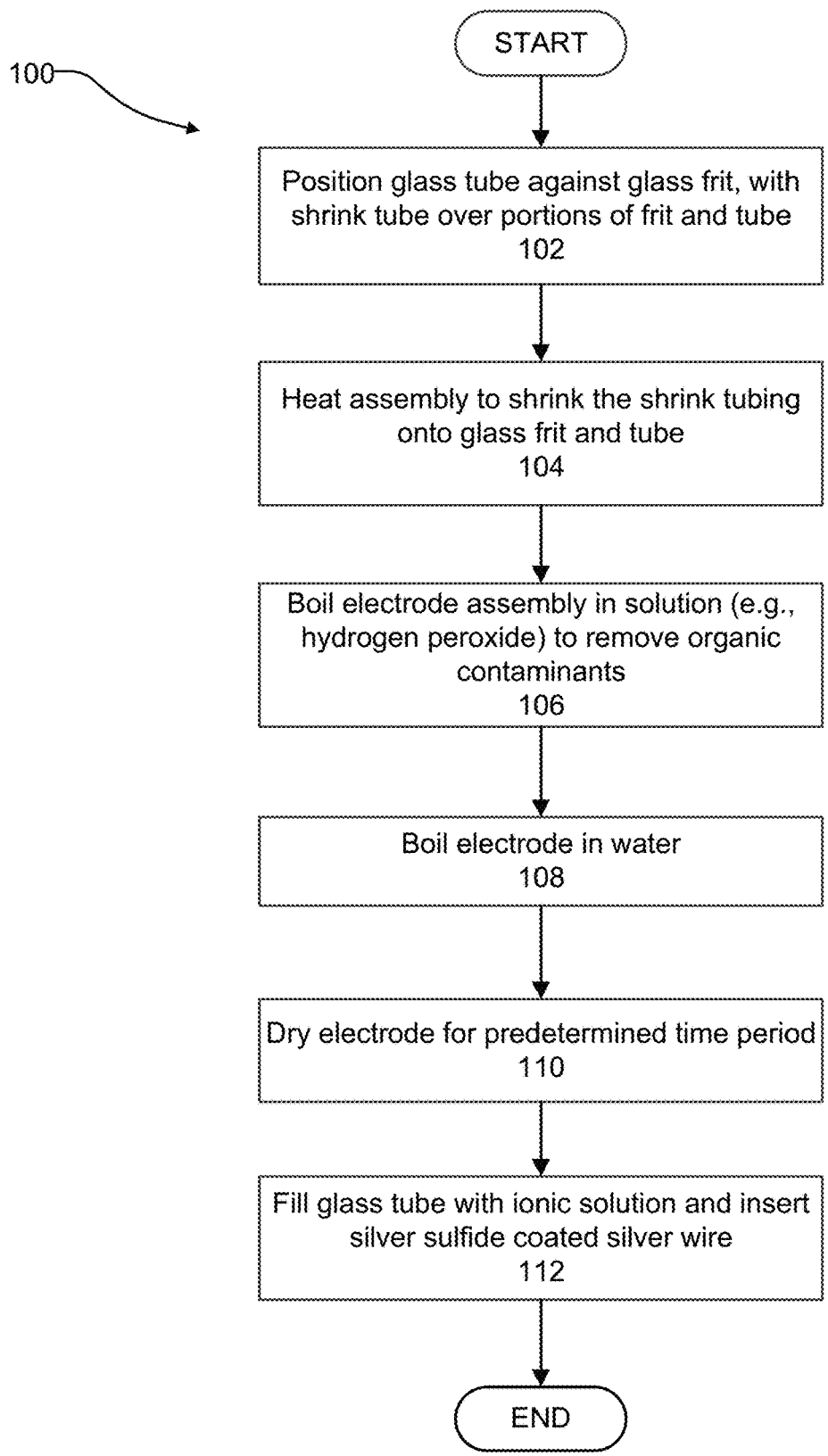
FIG. 4 is a high level flowchart of various operations that may be performed in constructing the reference electrode of FIG. 3.

With further reference to FIG. 3 and additional reference to flowchart 100 of FIG. 4, the assembly of the glass frit 14 and glass tube 16, using the shrink wrap tubing 12, may be accomplished by placing the shrink wrap tubing 12 over a portion 16a of the glass tube 16 and a portion 14a of the glass frit 14 (FIG. 4, operation 102), and baking the assembly in an oven for a time sufficient to shrink the shrink wrap tubing 12 onto the glass frit 14 and the glass tube 16 (FIG. 4, operation 104). For example, the baking may be performed at 350° C. for three or more hours to sufficiently shrink the shrink wrap tubing 14 onto the glass tube 16 and the glass frit 14.

The glass frit 14, glass tube 16 and shrink wrap assembly 12 may then be boiled in a suitable solution, for example hydrogen peroxide, to remove organic contamination in the glass frit 14 (FIG. 4, operation 106), and more particularly until an initial brown coloration of the glass frit disappears. The glass frit 14, glass tube 16 and shrink wrap 12 assembly may then be boiled in deionized water for about 10-20 minutes (FIG. 4, operation 108), then dried in an oven at a suitable temperature (e.g., about 140° C.) until thoroughly dried. The drying typically may take two or more hours (FIG. 4, operation 110). The glass tube 16 may then be filled with an ionic liquid, represented in FIG. 3 by dashed line 18. Finally, a silver sulfide coated silver wire 20 may be placed in the ionic liquid 18 within the glass tube 16 (FIG. 4, operation 112) preferably such that the wire extends generally parallel along a substantial portion of the longitudinal length of the glass tube.

FIG. 5 shows a high level flowchart 200 for constructing the silver sulfide coated silver wire 20. At operation 202 a quantity of sulfur may be placed on a hot plate. At operation 204 a silver wire having a desired gauge or diameter (for example, 0.5 mm diameter) may be supported in a stationary manner over the sulfur. At operation 206 the hot plate may be turned on to cause sublimation of sulfur onto the exterior surface of the silver wire. This produces a silver sulfide coating on the silver wire which appears as a black coating. Alternatively, a silver sulfide coating could also be formed by exposing the silver wire to hydrogen sulfide gas for a period of approximately 10 minutes, or by covering the silver wire with sulfur (powder) for 24 hours before rinsing the silver wire (coated with a black silver sulfide layer) with water.

FIG. 6 illustrates a graph 300 showing an example of the half-wave potential ($E_{1/2}$) of the oxidation and reduction of ferrocene/ferrocenium in curve 302, measured with respect to the silver wire electrode reference electrode coated with silver sulfide ($Ag_2S$) during a test. The curve 302 illustrates how after an initial break in period for a newly made reference electrode, denoted by portion 302a and covering typically 50-75 or so cycles, the potential stabilizes (portion 302b). Once stabilized, the potential drift is less than 10 mV for one week of continuous use, or at least one month of non-continuous use. Inset graph 304 illustrates how the voltage was ramped at a specified rate from the lower to the upper voltage limit shown, and back, during this test.

The reference electrode 10 of the present disclosure is especially useful with non-aqueous solutions, where the potential of the reference electrode 10 is largely independent of the solution both within the electrode (filling solution) and outside the electrode (electrolyte). The potential of the reference electrode 10 is fixed by the reduction reaction of silver ions ($Ag^+$) to silver metal (Ag), which occurs at the interface of a silver wire that is coated with silver sulfide. The potential of electrode 10 is determined by the $Ag^+$ concentration, which is a function of the solubility of the silver sulfide coating. These coatings are chosen for their very low solubility, thus the $Ag^+$ and $S^{2-}$ concentrations remain low and stable throughout the experiment. The filling solution of the reference electrode can be matched to the electrolyte in the system, thereby avoiding the junction potential that would be present if the filling solution was different from the electrolyte.

The reference electrode 10 of the present disclosure provides a number of significant advantages over heretofore manufactured reference electrodes used with ionic liquids. The electrode 10 is relatively easy to manufacture and highly reproducible. It can be made in a normal air atmosphere, has no detrimental sensitivity to air or water, and is not sensitive to light. Additional advantages of the reference electrode 10 are that the same ionic liquid may be used inside and outside the electrode glass tube 16. Therefore, there is no liquid junction potential (or possibly only an exceedingly small liquid junction potential). The silver ion concentration is held constant by the equilibrium of the sparingly soluble silver sulfide coating on the silver wire, which results in virtually no voltage potential drift during extended periods of use.

An important use of the electrode 10 is expected to be as a reference electrode for use in experiments involving ionic liquids. The stability or solubility of silver salts in each ionic liquid does not need to be known beforehand, as the silver ion concentration is determined by the solubility of the silver sulfide coating. Furthermore, electrode 10 can be assembled in a normal air atmosphere (no glovebox required), making it well suited to industrial processes.

Applications for the reference electrode 10 may include development and monitoring of energy storage systems with non-aqueous solvents (i.e., Lithium ion batteries), as well as plating, coating and electroforming applications involving non-aqueous solvents. It is possible that the reference electrode 10 may also find application with organic solvents such as acetonitrile, or deep eutectic solvents. The reference electrode 10 may of course also be used in aqueous solvents.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for forming a reference electrode for use in electrochemical testing applications, the method comprising:
    positioning a porous frit against one end of a hollow tube;
    securing the frit and the hollow tube to one another to form an assembly;
    boiling the assembly in a solution to remove organic contaminants; and
    drying the assembly;
    forming a silver sulfide coating on a silver wire to produce a silver sulfide coated silver wire;
    filling the hollow tube with a non-aqueous solution; and
    inserting at least a portion of the silver sulfide coated silver wire into the non-aqueous solution in the hollow tube.

2. The method of claim 1, wherein securing the frit and the hollow tube comprises:
    arranging a portion of shrink wrap over portions of the frit and the hollow tube; and
    heating the portion of shrink wrap, the hollow tube and the frit to shrink the shrink wrap onto the portions of the frit and the hollow tube to form the assembly.

3. The method of claim 2, wherein heating the portion of shrink wrap comprises heating the portion of shrink wrap to a temperature of about 350° C. for at least three hours.

4. The method of claim 1, wherein positioning the frit against one end of a hollow tube comprises positioning a glass frit against one end of a hollow glass tube.

5. The method of claim 1, wherein inserting the at least a portion of the silver sulfide coated silver wire into the non-aqueous solution in the hollow tube comprises using a silver wire having a thickness of about 0.5 mm.

6. The method of claim 5, wherein forming the reference electrode comprises forming a reference electrode with a volume of no more than about 0.5 mL.

7. The method of claim 6, wherein securing the hollow tube and the frit to form the assembly comprises securing a hollow tube with a diameter of no more than about 4 mm to the frit, and wherein a ratio of the silver wire diameter to the hollow tube diameter is about 1:8.

8. The method of claim 1, further comprising:
    subsequent to boiling the assembly in a solution to remove organic contaminants and prior to drying the assembly, boiling the assembly in water.

9. The method of claim 8, wherein boiling the assembly in the solution comprises boiling the assembly in hydrogen peroxide.

10. The method of claim 8, wherein drying the assembly comprises drying the assembly in an oven at a temperature of about 140° C.

11. The method of claim 1, wherein forming the silver sulfide coating on the silver wire comprises:
    placing a quantity of sulfur on a hot plate;
    arranging the silver wire over the sulfur; and
    using the hot plate to heat the sulfur to cause sublimation of the sulfur and subsequent reaction with the silver wire, to thus form the silver sulfide coated silver wire.

12. The method of claim 1, wherein forming a silver sulfide coating on a silver wire comprises:
    placing elemental sulfur powder in a vial;
    inserting a clean silver wire into the elemental sulfur powder in the vial;
    leaving the silver wire in contact with the elemental sulfur powder for a period of at least 24 hours to form the silver sulfide coating on the silver wire; and
    removing the silver wire from the elemental sulfur powder and rinsing the silver sulfide coated silver wire to remove any portion of the elemental sulfur powder that did not react to form the silver sulfide coating.

13. The method of claim 1, wherein forming a silver sulfide coating on a silver wire comprises:
    exposing a clean silver wire to a hydrogen sulfide atmosphere containing hydrogen sulfide gas; and
    maintaining the clean silver wire in the hydrogen sulfide atmosphere for at least 10 minutes until a silver sulfide coating has formed on a surface of the clean silver wire.

14. The method of claim 1, further comprising:
    measuring a stability of the reference electrode by:
        submerging the reference electrode in an ionic liquid solution that contains a redox active couple;
        at least one of scanning or cycling a potential in a range where the redox active couple undergoes a redox reaction;
        measuring a potential of a redox peak throughout multiple potential cycles; and
        using a potential drift of the redox peak to quantify the stability of the reference electrode.

15. A method for forming a reference electrode for use in electrochemical testing applications, the method comprising:
    positioning a cylindrical porous frit against one end of a hollow tube, where the hollow tube has a volume of about 0.1-0.5 mL and a diameter of about 4 mm, and the porous frit and the hollow tube have a common outer diameter;
    securing the frit to one end of the hollow tube using a portion of flexible material, to form an assembly;

boiling the assembly in a solution to remove organic contaminants;
boiling the assembly in water; and
drying the assembly;
forming a silver sulfide coating on a silver wire to produce a silver sulfide coated silver wire, and wherein the silver wire before forming the silver sulfide coating comprises a diameter of about 0.5 mm, to produce a ratio of the silver wire diameter to the hollow tube diameter of about 1:8;
filling the hollow tube with a non-aqueous solution; and
inserting at least a portion of the silver sulfide coated silver wire into the non-aqueous solution in the hollow tube.

16. The method of claim 15, wherein securing the frit and the hollow tube comprises:
arranging a portion of shrink wrap over portions of the frit and the hollow tube; and
heating the portion of shrink wrap, the hollow tube and the frit to shrink the shrink wrap onto the portions of the frit and the hollow tube to form the assembly.

17. The method of claim 16, wherein heating the portion of shrink wrap comprises heating the portion of shrink wrap to a temperature of about 350° C. for at least three hours.

18. The method of claim 15, wherein boiling the assembly in the solution comprises boiling the assembly in hydrogen peroxide.

19. The method of claim 15, wherein drying the assembly comprises drying the assembly in an oven at a temperature of about 140° C.

20. A method for forming a reference electrode for use in electrochemical testing applications, the method comprising:
positioning a porous frit against one end of a hollow tube;
securing the frit and the hollow tube to one another to form an assembly;
boiling the assembly in a solution to remove organic contaminants;
boiling the assembly in water; and
drying the assembly;
forming a silver sulfide coating on a silver wire to produce a silver sulfide coated silver wire;
filling the hollow tube with a non-aqueous solution;
inserting at least a portion of the silver sulfide coated silver wire into the non-aqueous solution in the hollow tube.

21. A method for forming a reference electrode for use in electrochemical testing applications, the method comprising:
positioning a porous frit against one end of a hollow tube;
securing the frit and the hollow tube to one another to form an assembly;
forming a silver sulfide coating on a silver wire to produce a silver sulfide coated silver wire;
filling the hollow tube with a non-aqueous solution; and
inserting at least a portion of the silver sulfide coated silver wire into the non-aqueous solution in the hollow tube;
wherein forming a silver sulfide coating on a silver wire includes:
placing elemental sulfur powder in a vial;
inserting a clean silver wire into the elemental sulfur powder in the vial;
leaving the silver wire in contact with the elemental sulfur powder for a period of at least 24 hours to form the silver sulfide coating on the silver wire; and
removing the silver wire from the elemental sulfur powder and rinsing the silver sulfide coated silver wire to remove any portion of the elemental sulfur powder that did not react to form the silver sulfide coating.

* * * * *